(12) United States Patent
Fritz et al.

(10) Patent No.: US 8,987,130 B2
(45) Date of Patent: Mar. 24, 2015

(54) REACTIVE BONDING OF A FLIP CHIP PACKAGE

(75) Inventors: Gregory M. Fritz, Yorktown Heights, NY (US); Eric P. Lewandowski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 13/482,414

(22) Filed: May 29, 2012

(65) Prior Publication Data

US 2013/0320529 A1    Dec. 5, 2013

(51) Int. Cl.
*H01L 21/76* (2006.01)
*H01L 23/498* (2006.01)
*H01L 23/00* (2006.01)

(52) U.S. Cl.
CPC ..... *H01L 23/49866* (2013.01); *H01L 23/49811* (2013.01); *H01L 2224/75264* (2013.01); *H01L 2224/16501* (2013.01); *H01L 24/13* (2013.01); *H01L 24/16* (2013.01); *H01L 24/75* (2013.01); *H01L 24/81* (2013.01); *H01L 2224/05582* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/0566* (2013.01); *H01L 2224/16238* (2013.01); *H01L 2224/81192* (2013.01); *H01L 2224/81222* (2013.01); *H01L 2224/81455* (2013.01); *H01L 2224/81457* (2013.01); *H01L 2224/8146* (2013.01); *H01L 2224/81815* (2013.01); *H01L 2224/13006* (2013.01); *H01L 2224/05572* (2013.01); *H01L 2224/81466* (2013.01); *H01L 2224/131* (2013.01)
USPC ............ 438/612; 438/613; 438/614; 438/615

(58) Field of Classification Search
USPC .................................................. 438/612–615
See application file for complete search history.

(56) References Cited

U.S. PATENT DOCUMENTS 4,983,804 A    1/1991    Chan et al.
5,538,795 A    7/1996    Barbee, Jr. et al.
(Continued)

OTHER PUBLICATIONS

Yang, H-A. et al., "Localized Induction Heating Solder Bonding for Wafer Level MEMS Packaging" Journal of Micromechanics and Microengineering (Feb. 2005) pp. 394-399, vol. 15.

(Continued)

*Primary Examiner* — Samuel Gebremariam
(74) *Attorney, Agent, or Firm* — Scully, Scott, Murphy & Presser, P.C.; Louis J. Percello, Esq.

(57) ABSTRACT

An array of bonding pads including a set of reactive materials is provided on a first substrate. The set of reactive materials is selected to be capable of ignition by magnetic heating induced by time-dependent magnetic field. The magnetic heating can be eddy current heating, hysteresis heating, and/or heating by magnetic relaxation processes. An array of solder balls on a second substrate is brought to contact with the array of bonding pads. A reaction is initiated in the set of magnetic materials by an applied magnetic field. Rapid release of heat during a resulting reaction of the set of reactive materials to form a reacted material melts the solder balls and provides boding between the first substrate and the second substrate. Since the magnetic heating can be localized, the heating and warpage of the substrate can be minimized during the bonding process.

17 Claims, 15 Drawing Sheets

(56) References Cited

U.S. PATENT DOCUMENTS

| | | |
|---|---|---|
| 7,635,076 B2 | 12/2009 | Duckham et al. |
| 7,902,060 B2 | 3/2011 | Swaminathan |
| 2010/0159692 A1* | 6/2010 | Swaminathan ............... 438/613 |
| 2011/0291276 A1* | 12/2011 | Swaminathan et al. ...... 257/741 |

OTHER PUBLICATIONS

Calabro, J.D. et al., "Magnetically Driven Three-Dimensional Manipulation and Inductive Heating of Magnetic-Dispersion Containing Metal Alloys" PNAS (Mar. 16, 2010) pp. 4834-4839, vol. 107, No. 11.

Habib, A.H. et al., "Novel Solder-Magnetic Particle Composites and Their Reflow Using AC Magnetic Fields" IEEE Transactions on Magnetics (Jun. 2010) pp. 2187-2190, vol. 46, No. 6.

Braeuer, J. et al., "Room-Temperature Reactive Bonding by Using Nano Scale Multilayer Systems" Transducers '11 (Jun. 5-9, 2011) pp. 1332-1335, Vol.

Wang, J. et al., "Room-Temperature Soldering with Nanostructured Foils" Applied Physics Letters (Nov. 10, 2003) pp. 3987-3989, vol. 83, No. 19.

Boettge, B. et al., "Fabrication and Characterization of Reactive Nanoscale Multilayer Systems for Low-Temperature Bonding in Microsystem Technology" Journal of Micromechanics and Microengineering (Jun. 1, 2010) pp. 1-8, vol. 20.

Subramanian, J.S. et al., "Room Temperature Soldering of Microelectronic Components for Enhanced Thermal Performance" IEEE, 6th Int. Conf. on Thermal, Mechanical and Multiphysics Simulation and Experiments in Micro-Electronics and Micro-Systems, EuroSimE (Apr. 18-20, 2005) pp. 681-686.

Heihs, T.P. et al., "Room Temperature Lead-Free Soldering of Microelectronic Components using a Local Heat Source" The Preliminary Program for Materials Solutions Conference and Exposition (Oct. 18-21, 2004).

Fischer, S.H. et al., "A Survey of Combustible Metals, Thermites, and Intermetallics for Pyrotechnic Applications" Presented at the 32nd AIAA/ASME/SAE/ASEE Joint Propulsion Conference (Jul. 1-3, 1996) pp. 1-13, vol. SAND95-2248C.

* cited by examiner

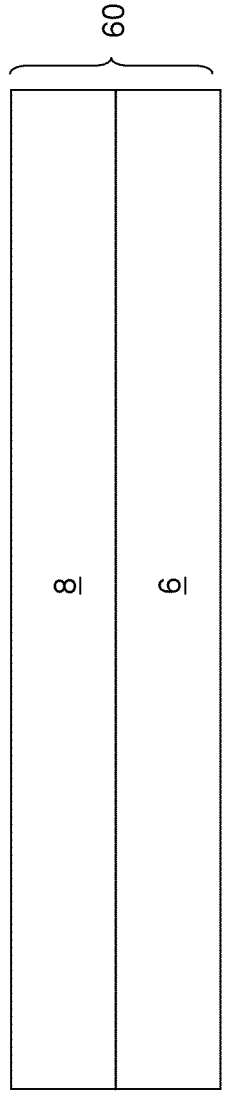
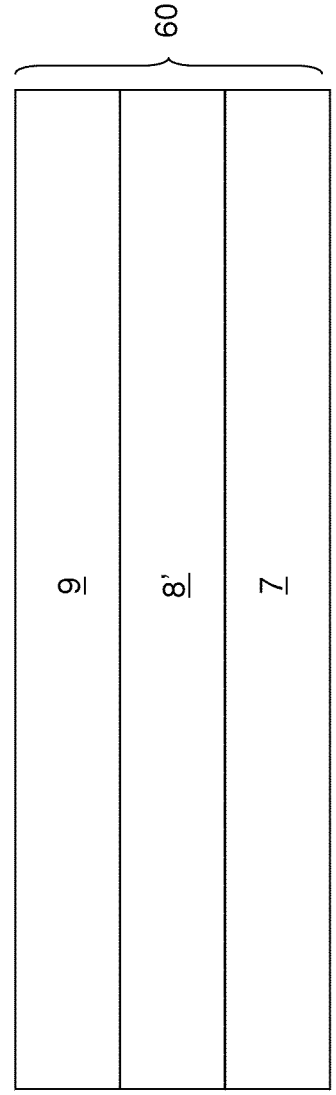

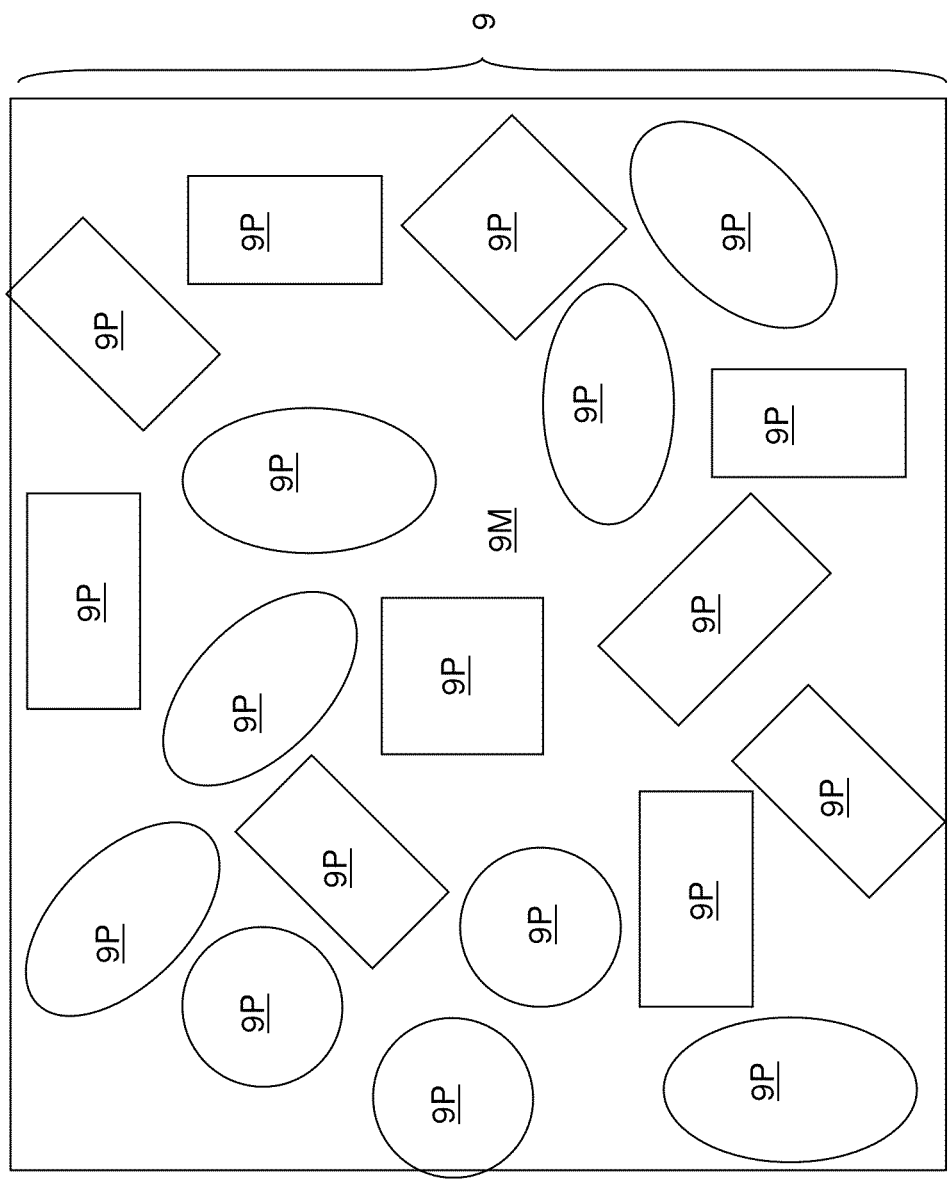

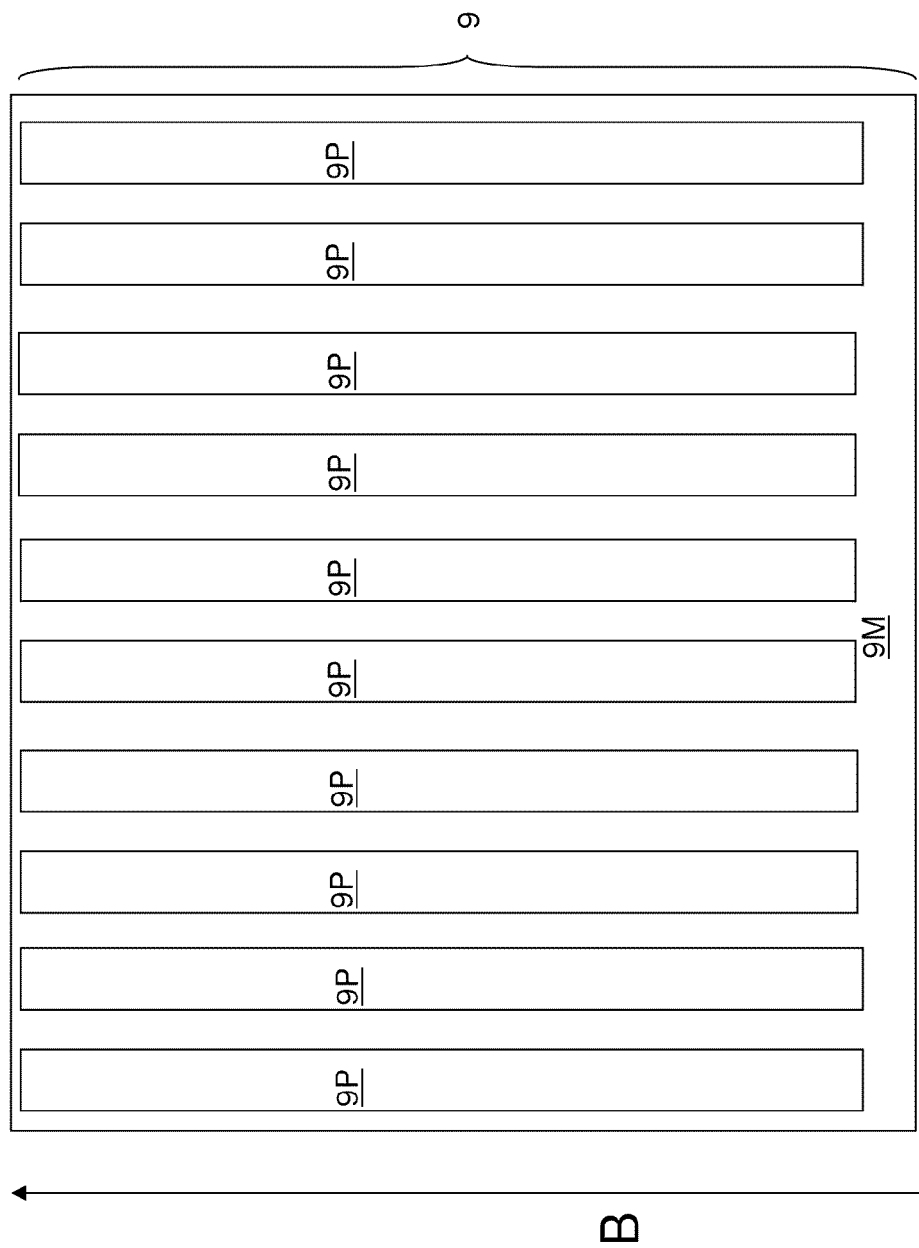

REACTIVE BONDING OF A FLIP CHIP PACKAGE

BACKGROUND

The present disclosure relates to semiconductor structures, and particularly to flip chip bonding employing bonding pads including reactive materials, and a structure for effecting the same.

Once formation of semiconductor devices and interconnects on a semiconductor wafer (substrate) is completed, the semiconductor wafer is diced into semiconductor chips, or "dies." Functional semiconductor chips are then packaged to facilitate mounting on a circuit board. A package is a supporting element for the semiconductor chip that provides mechanical protection and electrical connection to an upper level assembly system such as the circuit board. One typical packaging technology is Controlled Collapse Chip Connection (C4) packaging, which employs solder balls each of which contacts a C4 pad on the semiconductor chip and another C4 pad on a packaging substrate. Other packaging technologies employ micro C4's or C2's. The packaging substrate may then be assembled on the circuit board.

Thus, the packaging substrate facilitates formation of an electrical link between the semiconductor chip and a system board of a computer. A semiconductor chip is mounted on a die foot print area located on a top surface of the packaging substrate. The die foot print area contains C4 pads on which a semiconductor chip may be attached by C4 bonding. A typical semiconductor chip employing a packaging substrate may comprise about 10,000~100,000 input/output nodes. Each of these nodes are electrically connected to a C4 pad on a top surface of the semiconductor chip in a two dimensional array.

During C4 bonding of a semiconductor chip and a packaging substrate, the semiconductor chip with bonded solder balls is brought into contact with the bonding pads of the packaging substrate at an elevated temperature in an oven. Another common tool used is a flip chip bonder. Thus, the temperature of the packaging substrate may be elevated close to the reflow temperature of the solder balls. The elevated temperature during the bonding process subjects the semiconductor chip and the packaging substrate to thermal warp, i.e., the warp caused by thermal expansion of materials with temperature.

The thermal warp of the packaging substrate and the semiconductor chip causes alignment problems and stress-induced reliability problems for C4 bonding. Particularly, the thermal warp of the packaging substrate poses a challenge because the thermal expansion coefficient of a packaging substrate tends to be greater than the thermal expansion coefficient of a semiconductor substrate. Large thermal warp causes the packaging substrate to change shape during the heat up period prior to bonding, and leads to potential nonwets or unequal C4 solder heights. Further, large thermal warp during the cool down period after the reflow of solder balls can lead to defects in the solder ball joints such as hot tears.

BRIEF SUMMARY

An array of bonding pads including a set of reactive materials is provided on a first substrate. The set of reactive materials is selected to be capable of ignition by magnetic heating induced by time-dependent magnetic field. The magnetic heating can be eddy current heating, hysteresis heating, and/or heating by magnetic relaxation processes. An array of solder balls on a second substrate is brought to contact with the array of bonding pads. A reaction is initiated in the set of magnetic materials by an applied magnetic field. Rapid release of heat during a resulting reaction of the set of reactive materials to form a reacted material melts the solder balls and provides boding between the first substrate and the second substrate. Since the magnetic heating can be localized, the heating and warpage of the substrate can be minimized during the bonding process.

According to an aspect of the present disclosure, a method of bonding substrates is provided. The method includes: providing a first substrate bonded to an array of solder balls; providing a second substrate having an array of bonding pads thereupon, wherein each of the bonding pads includes a set of reactive materials including a first material and a second material that, upon ignition, react spontaneously to form an alloy or a composite of the first material and the second material, wherein a magnetic material is present within each of the bonding pads as the first material, the second material, or an additional metal; bringing the array of solder balls into contact with the array of bonding pads; and igniting the set of reactive materials by heating the magnetic material through a time-dependent magnetic field, wherein the array of solder balls is bonded to the array of bonding pads through heat generated by spontaneous reaction of the set of reactive materials.

According to another aspect of the present disclosure, a structure for bonding substrates is provided. The structure includes a substrate having an array of bonding pads thereupon, wherein each of the bonding pads includes at least one unit reactive-material-including stack including a set of reactive materials including a first material and a second material that, upon ignition, react spontaneously to form an alloy or a composite of the first material and the second material, wherein a magnetic material is present within each of the bonding pads as the first material, the second material, or an additional metal.

BRIEF DESCRIPTION OF THE SEVERAL VIEWS OF THE DRAWINGS

FIG. 4 is a vertical cross-sectional view of a first example for a unit reactive-material-including stack according to a first embodiment of the present disclosure.

FIG. 5 is a vertical cross-sectional view of a second example for the unit reactive-material-including stack according to a second embodiment of the present disclosure.

FIG. 5A is a horizontal cross-sectional view of a first example of the magnetic material-including layer according to the second embodiment of the present disclosure.

FIG. 5C is a horizontal cross-sectional view of a third example of the magnetic material-including layer according to the second embodiment of the present disclosure.

DETAILED DESCRIPTION

As stated above, the present disclosure relates to flip chip bonding employing bonding pads including reactive materials, and a structure for effecting the same, which are now described in detail with accompanying figures. The drawings are not drawn to scale. It is understood that terms referring to a plurality of elements also encompass embodiments in which a single element is employed.

As used herein a "set of reactive materials" refer to a set of materials which include two or more reactant metals or metal compounds that can mix exothermically. A set of reactive materials is typically a pair of metals or a pair of a metal and a metal oxide. A set of reactive materials can be provided as a particle compact or a multilayer stack of the two dissimilar materials. The reaction in a set of reactive material can be initiated by local or global heating and the heat from the reaction can be used to melt a solder or braze in order to form a bond.

As used herein, "ignition" or "to ignite" refers to initiation of a self-sustaining exothermic reaction that causes a pair of metals to form an interdiffused metal alloy or to cause a pair of a metal and a metal oxide to undergo a reduction/oxidation reaction and to form a different metal/metal oxide couple or other combinations of the pair of the metal and the metal oxide.

As used herein, a "time-varying magnetic field" refers to a magnetic field of which the magnitude changes in time.

Figure 1:
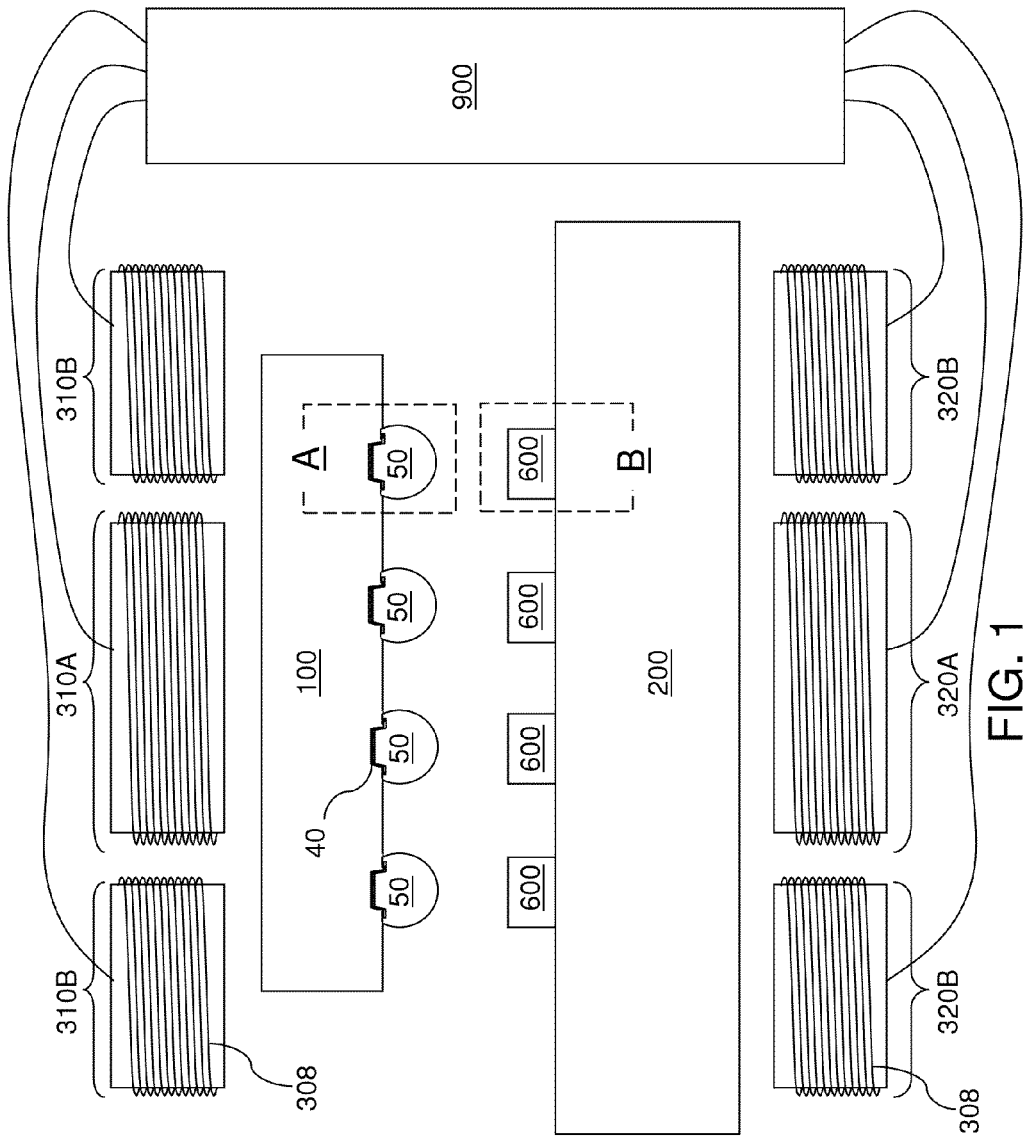
FIG. 1 shows a vertical cross-sectional view of a first exemplary structure for reactive bonding of substrates according to an embodiment of the present disclosure.
Figure 1A:
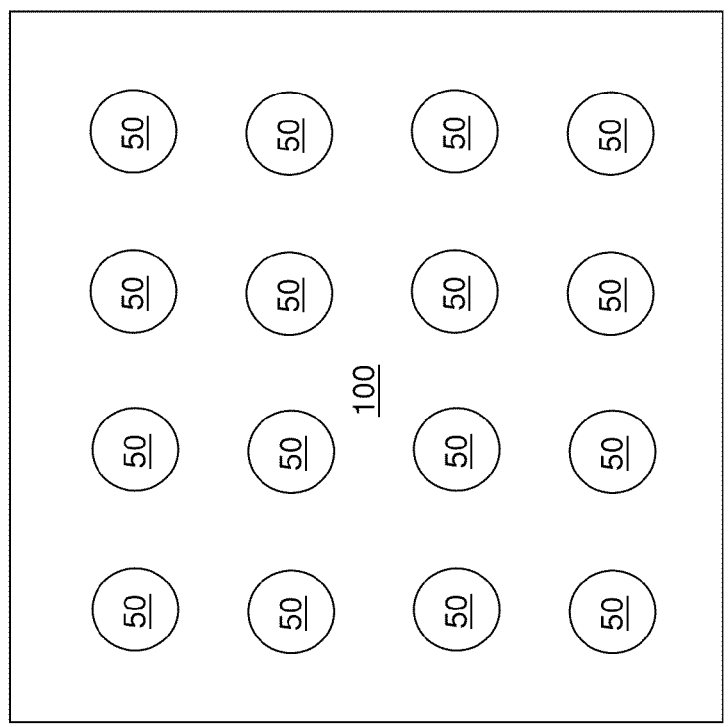
FIG. 1A is a bottom-up view of the semiconductor substrate and an array of solder balls in FIG. 1.
Figure 1B:
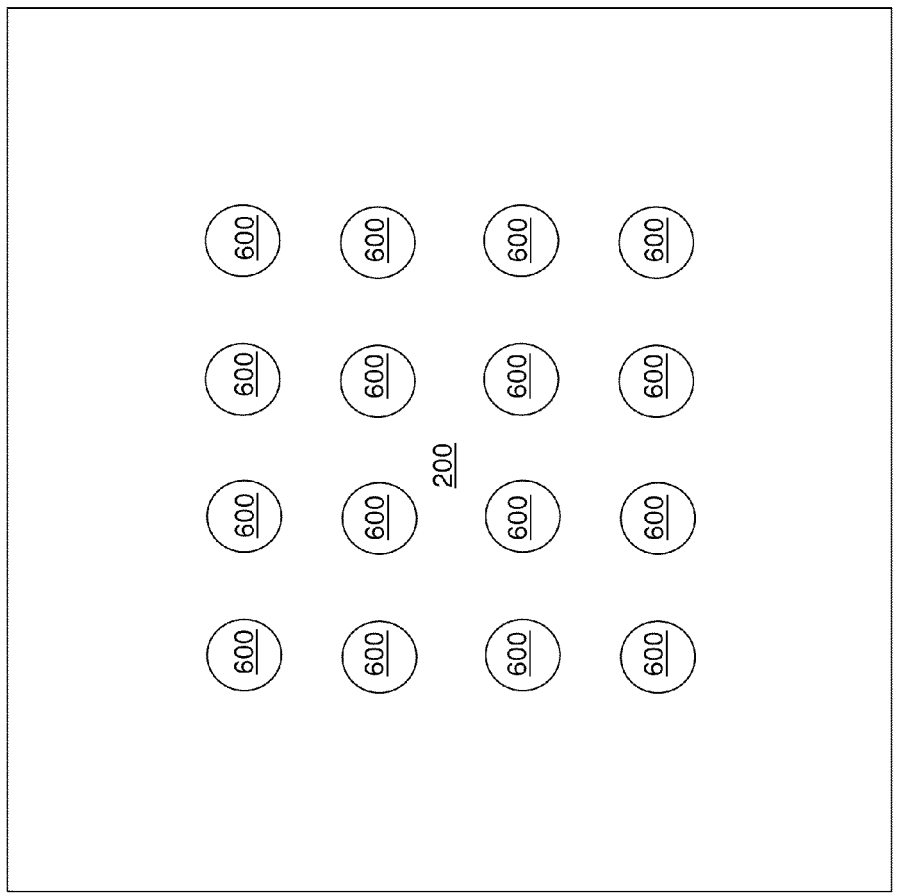
FIG. 1B is a top-down view of the packaging substrate and an array of reactive bonding pads in FIG. 1.

Referring to FIGS. 1, 1A, and 1B, a first exemplary structure for reactive bonding of substrates according to an embodiment of the present disclosure includes a first substrate 100 bonded to an array of solder balls 50 and a second substrate 200 having an array of bonding pads 600 thereupon. Each of the bonding pads 600 includes a set of reactive materials including a first material and a second material. The first material and the second material are selected such that, upon ignition, the first material and the second material react spontaneously to form an alloy or a composite of the first material and the second material. A magnetic material is present within each of the bonding pads 600 as the first material, the second material, or an additional metal.

In one embodiment, the first substrate 100 can be a semiconductor chip including at least one semiconductor device electrically connected to the array of solder balls 50, and the second substrate 200 can be a packaging substrate including metal wiring structures electrically connected to the array of bonding pads 600.

Once the first substrate 100 bonded to the array of solder balls 50 and the second substrate 200 having the array of bonding pads thereupon are provided, the first substrate 100 and the second substrate 200 can be oriented to face each other, and the array of solder balls 50 is aligned to the array of bonding pads 600. For example, the first substrate 100 can be oriented such that the first substrate 100 overlies or underlies the second substrate 200, and the array of solder balls 50 is oriented in a direction that faces the array of bonding pads 600. The array of solder balls 50 and the array of bonding pads 600 can have the same pitch in all directions so that each solder ball 50 can contact a bonding pad 600, and each bonding pad 600 can contact a solder ball 50. Alternately, a plurality of pitches can be employed across different portions of the array of solder balls 50 and/or across different portions of the array of bonding pads 600. The total number of bonding pads 600 can be from 1 to 100,000. In one embodiment, the total number of bonding pads 600 can be from 10 to 10,000.

The first substrate 100 and the second substrate 200 can be placed within an apparatus for generating time-varying magnetic field. The apparatus is oriented such that a magnetic field is applied to the array of bonding pads 600 when the time-varying magnetic field is generated. The array of solder balls 50 can be brought into contact with the array of bonding pads 600 after placement within the apparatus, concurrently with placement within the apparatus, or after placement within the apparatus.

In one embodiment, the apparatus can include at least one electromagnet (i.e., a single electromagnet or a plurality of electromagnets) and a power supply device 900 configured to control the electrical current that flows through each electromagnet. The electromagnets are arranged to generate the time-varying magnetic field within a region in which the first substrate 100 and the second substrate 200 can be placed and assembled in a configuration in with the array of solder balls 50 contacts the array of bonding pads 600. Power cables from the power supply device 900 to the various electromagnets (310A, 310B, 320A, 320B) are schematically illustrated by lines connecting the power supply device to the various electromagnets (310A, 310B, 320A, 320B).

In one embodiment, a plurality of electromagnets can be employed, which can include, for example, a top center electromagnet 310A, at least one top peripheral electromagnet 310B, a bottom center electromagnet 320A, and at least one bottom peripheral electromagnet 320B.

The magnetic field generated by the at least one electromagnet is employed to heat the magnetic component in the bonding pads 600, i.e., the magnetic material that is present within each of the bonding pads 600 as the first material, the second material, or an additional metal.

In one embodiment, the magnitude of the magnetic field generated by the at least one electromagnet can saturate the magnetic field in the magnetic material, thereby providing a higher heating rate for the magnetic material than a non-saturating magnetic field. Typical saturation field magnitudes for soft magnetic materials such as Ni, Fe, Co and their alloys are between 0.3 Tesla and 3.0 Tesla. Hard magnetic materials also have comparable saturation field magnitudes.

Figure 2:
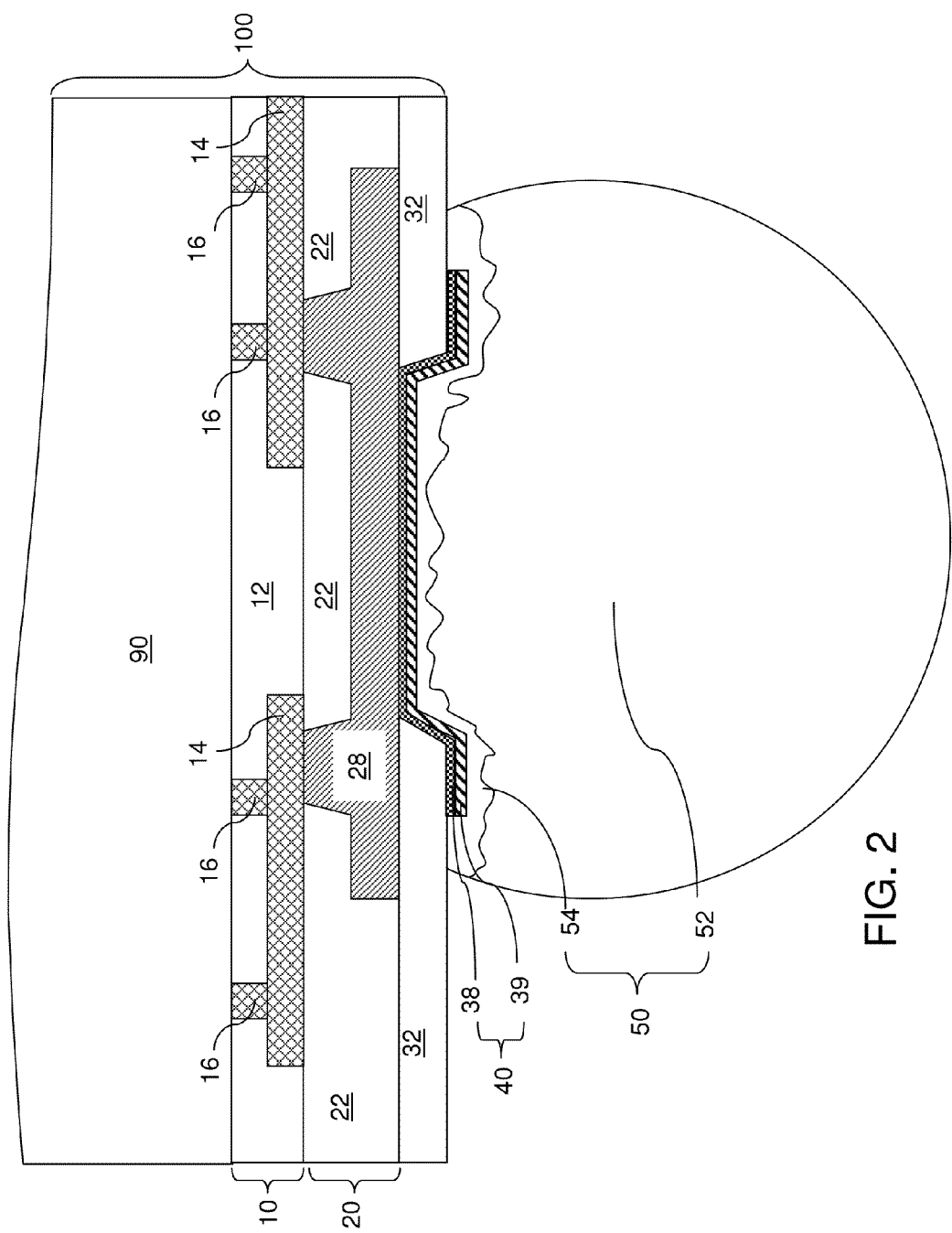
FIG. 2 is a magnified view of region A of FIG. 1.

Referring to FIG. 2, a magnified view of region A of FIG. 1 illustrates exemplary structures that can be present within the first substrate 100. The first substrate 100 can be a semiconductor substrate including a semiconductor device including substrate 90, a back-end-of-line (BEOL) interconnect structure 10, a last level interconnect structure 20, and a dielectric passivation layer 32. Semiconductor devices (not shown) are present in the semiconductor device including substrate 90. In one embodiment, additional BEOL interconnect structures (not shown) are present between the semiconductor devices and the BEOL interconnect structure 10 within a lower portion of the semiconductor device including substrate 90.

The BEOL interconnect structure 10 can include a back-end-of-line (BEOL) dielectric layer 12, back-end-of-line (BEOL) metal lines 14, and back-end-of-line (BEOL) metal vias 16. The BEOL metal lines 14 and the BEOL metal vias 16 can be embedded in the BEOL dielectric layer 12. The BEOL dielectric layer 12 can include, for example, silicon oxide or a low-k dielectric material known in the art. The BEOL metal lines 14 and the BEOL metal via 16 can include a conductive metal such as Cu or W, and are formed by methods well known in the art.

The last level interconnect structure 20 can include a last level dielectric layer 22 and a last level metal plate 28. The last level dielectric layer 22 can include a dielectric material such as silicon oxide. The last level metal plate 28 can include a metal such as aluminum. In one embodiment, the last level metal plate 28 is integrally formed with at least one via that electrically connects the last level metal plate 28 with the BEOL metal lines 14.

The dielectric passivation layer 32 includes an impervious dielectric material that blocks ingress of moisture and oxygen into the last level interconnect structure 20. An exemplary impervious dielectric material includes silicon nitride. The dielectric passivation layer 32 can be a homogeneous layer including the impervious dielectric material, or can be a stack of multiple dielectric material layers including an impervious dielectric material layer. The thickness of the dielectric passivation layer 32 can be, for example, from about 2.0 μm to about 40 μm.

The dielectric passivation layer 32 has an opening that exposes a top surface of the last level metal plate 28. Typically, the dimension of the opening, e.g., a diameter of the opening, is from about 50 μm to about 100 μm. For micro C4 openings, the diameter of the opening can be on the order of 10 μm. The opening is formed by lithographic patterning of a photosensitive resist that is removed after patterning of the opening, or a photosensitive polyimide which may form a part of the passivation layer 32.

A first-substrate bonding pad 40 can include a stack of a metallic adhesion layer 38 and a metallic pad material layer 39. The metallic adhesion layer 38 can include a metallic material that provides good adhesion to underlying structures including the last level metal plate 28 and the dielectric passivation layer 32. Exemplary materials for the metallic adhesion layer 38 include Ti, TiN, and TiW. The thickness of the metallic adhesion layer 38 can be from about 100 nm to about 500 nm, although lesser and greater thicknesses can also be employed. The metallic pad material layer 39 can include Cu, Al, Au, Ag, Fe, or Ni, and combinations and/or alloys thereof. The thickness of the metallic pad material layer 39 can be from 1 micron to 10 microns, although lesser and greater thicknesses can also be employed.

The solder ball 50 includes an original composition region 52 which includes the original composition of the solder ball 50 before bonding to the first substrate 100 and an altered composition region 54 which has a composition that is modified from the original composition by diffusion of the materials from the first-substrate bonding pad 40.

Figure 3:
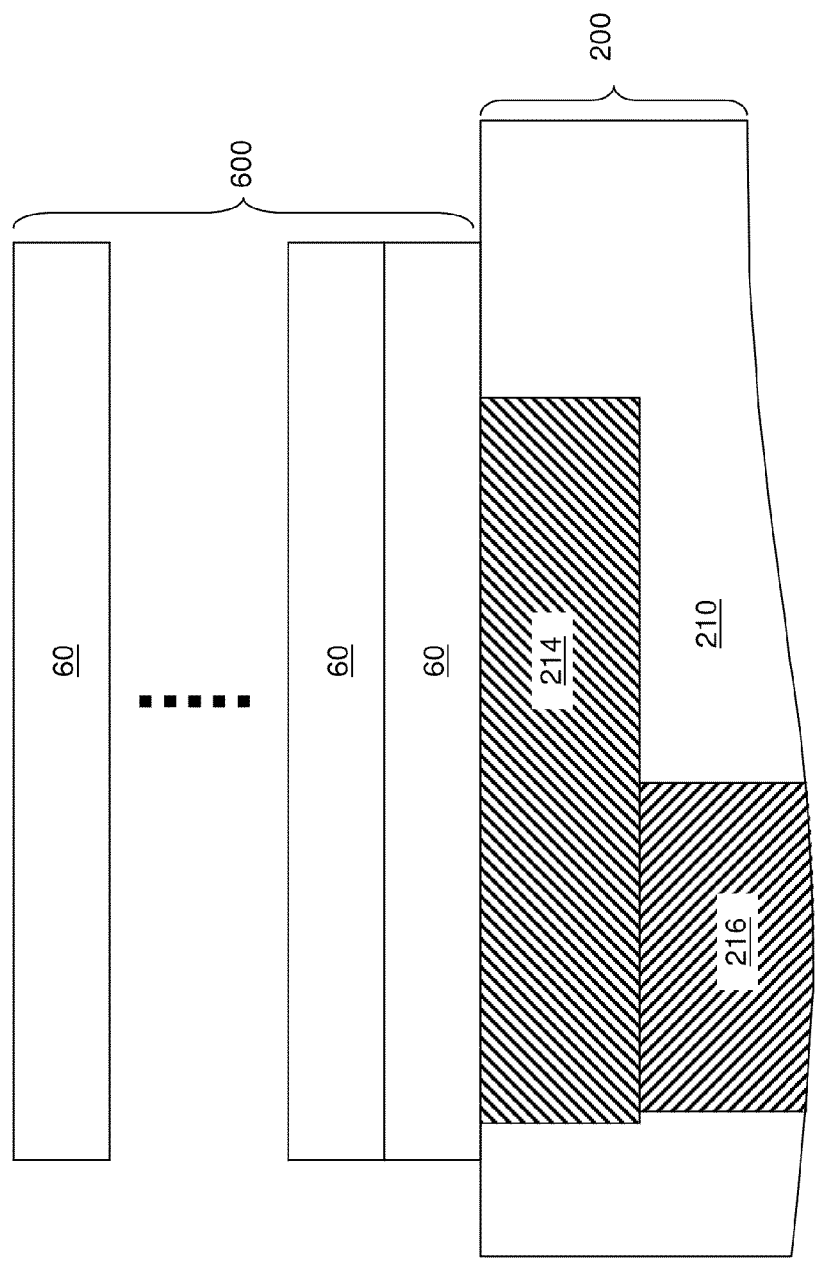
FIG. 3 is a magnified view of region B of FIG. 1.

Referring to FIG. 3, the second substrate 200 can be a packaging substrate embedding metal lines 214 and metal via structures 216 that provide interconnection from the bonding pads 600 to connection ports (not shown) located on the opposite side of the bonding pads 600. The second substrate 200 can be any packaging substrate known in the art.

The array of bonding pads 600 can have the same periodicity as the array of solder balls 50. Further, the array of bonding pads 600 can have at least the same number of bonding pads 600 as the total number of solder balls 50. As discussed above, a plurality of different pitches can be employed for different portions of the array of bonding pads 600 and the array of solder balls 50 provided that each solder balls 50 can contact one of the bonding pads 600.

Within each bonding pad 600, the orientation and geometry, microstructure, and stress state of the magnetic material can be varied in order to optimize the heating when a time-dependent magnetic field is applied by the apparatus (900, 310A, 310B, 320A, 320B). For example, aligning layers of the magnetic material parallel to the applied time-dependent magnetic field can lead to more eddy currents than eddy currents generated when the magnetic field is applied perpendicular to the layers. Also, aligning the direction of the time-dependent magnetic field with an easy axis of magnetization in general leads to a larger hysteresis loop than a hysteresis loop obtained when the time-dependent magnetic field is applied perpendicular to the easy axis of magnetization. Once the set of reactive materials is ignited, the reaction may either react only where heated or may propagate to other regions of the set of reactive materials depending on the thermal properties of the surrounding materials. A set of reactive materials will sustain a self-propagating reaction when the rate of heat released from the reaction is larger than the rate of heat losses to the surroundings, and the velocity of the reaction can span several orders of magnitude ranging from approximately 1 mm/second to supersonic speeds.

FIG. 3 illustrates a first example for a bonding pad 600, which includes a single stack or multiple stacks of a unit reactive-material-including stack 60. Referring to FIG. 4, a first example for the unit reactive-material-including stack 60 is illustrated according to a first embodiment of the present disclosure.

In the first example of the unit reactive-material-including stack 60, two material layers are present. One of the two material layers includes the first material, and other of the two material layers includes the second material. A magnetic material can be selected for the first material and a non-magnetic material can be selected for the second material such that the first and second materials form a pair of reactive materials, which, upon ignition, react spontaneously to form an alloy or a composite of the first material and the second material.

The layer of the first material is herein referred to as a magnetic material layer 6, and the layer of the second material is herein referred to as a non-magnetic material layer 8. The thicknesses of each of the magnetic material layer 6 and the non-magnetic material layer 8 are selected such that the atomic ratio of the first and second materials is within a range that maintains the combination of the first material and the second material reactive, i.e., capable of igniting an exothermic reaction. Further, the thicknesses of the magnetic material layer 6 and the non-magnetic material layer 8 can also be optimized to control the rate of propagation of the reaction upon ignition. Table 1 lists reaction parameters for non-limiting examples of pairs of the first material and the second material.

TABLE 1

Reaction parameters for non-limiting examples of reactive material pairs.
(Source: Fischer, S. H. and Grubelich, M. C. 32nd AIAA/ASME/SAE/
ASEE Joint Propulsion Conference. 1996)

| First metal | Second metal | Atomic Ratio | Adiabatic Reaction Temperature (° C.) | Adiabatic Reaction Temperature (K) | Heat of Reaction (cal/cc) |
|---|---|---|---|---|---|
| Co | Al | 1:1 | 1,640 | 1,913 | 1,590 |
| Co | Al | 2:5 | 1,180 | 1,453 | 1,110 |
| Co | Si | 1:1 | 1,460 | 1,733 | 1,450 |
| Fe | Al | 1:1 | 1,150 | 1,423 | 1,020 |
| Fe | Al | 1:3 | 1,134 | 1,407 | 1,020 |
| Fe | Si | 1:1 | 1,386 | 1,659 | 1,020 |
| Ni | Al | 1:1 | 1,638 | 1,911 | 1,710 |
| Ni | Al | 3:1 | 1,251 | 1,524 | 1,230 |
| Ni | Nb | 1:1 | 810 | 1,083 | 610 |
| Ni | Si | 1:1 | 992 | 1,265 | 1,140 |

In one embodiment, each bonding pad 600 in the array of bonding pads 600 can include at least one unit reactive-material-including stack 60 (i.e., one unit reactive-material-including stack or a plurality of reactive material stacks). Each unit reactive-material-including stack 60 includes a layer of the first material, i.e., the magnetic material layer 6, and a layer of the second material, i.e., the non-magnetic material layer 8.

In one embodiment, the array of bonding pads 600 can be provided by forming material layers including one or more repetitions of the magnetic material layer 6 and the non-magnetic material layer 8 on the second substrate 200, and subsequently patterning the material layers to form the array of bonding pads 600. Each magnetic material layer 6 and each non-magnetic material layer 8 can be deposited, for example, by physical vapor deposition (PVD) or chemical vapor deposition. The thickness of each magnetic material layer 6 can be, for example, from 5 nm to 1,000 nm, and the thickness of each non-magnetic material layer 8 can be, for example, from 5 nm to 1,000 nm, although lesser and greater thicknesses can also be employed. The patterning of the material layers can be performed, for example, by applying a photoresist over the top surface of the material layers, lithographically patterning the photoresist to cover areas corresponding to the areas of the bonding pads 600 to be subsequently formed, and by removing the portions of the material layers that are not covered by the patterned photoresist. The photoresist is subsequently removed.

Referring to FIG. 5, a second example for the unit reactive-material-including stack 60 is illustrated according to the second embodiment of the present disclosure. In the second example of the unit reactive-material-including stack 60, three material layers are present. In this example, the first material and the second material are non-magnetic materials. The magnetic material is the additional material that is present in each of the unit reactive-material-including stack 60. One of the three material layers includes the first material, and is herein referred to as a first non-magnetic material layer 7. Another of the three material layers includes the second material, and is herein referred to as a second non-magnetic material layer 8'. Yet another of the three material layers includes the additional material, i.e., the magnetic material, and one of the first material and the second material. The layer that includes the additional material and one of the first and second materials is herein referred to as a magnetic material-including layer 9. The first material and the second material can be selected such that the first and second materials form a pair of non-magnetic reactive materials, which, upon ignition, react spontaneously to form an alloy or a composite of the first material and the second material.

The thicknesses of each of the first non-magnetic material layer 7 and the second non-magnetic material layer 8' are selected such that the atomic ratio of the first and second materials is within a range that maintains the combination of the first material and the second material reactive, i.e., capable of sustaining a spontaneous reaction that propagates upon ignition. Further, the thicknesses of the first non-magnetic material layer 7 and the second non-magnetic material layer 8' can also be optimized to control the rate of propagation of the reaction upon ignition. Table 2 lists non-limiting examples of pairs of the first material and the second material and accompanying magnetic material that can be employed in the magnetic material-including layer 9.

TABLE 2

Reaction parameters for non-limiting examples of reactive material pairs.

| First material | Second material | Magnetic material |
|---|---|---|
| Al | Ti | Fe, Co, Ni, and/or magnetic rare-earth materials |
| Ti | Amorphous Si | Fe, Co, Ni, and/or magnetic rare-earth materials |
| Al | $CuO_x$, x = 0.5, 0.75, or 1.0 | Fe, Co, Ni, and/or magnetic rare-earth materials |
| Al | Pt | Fe, Co, Ni, and/or magnetic rare-earth materials |

In one embodiment, each bonding pad 600 in the array of bonding pads 600 can include at least one unit reactive-material-including stack 60 (i.e., one unit reactive-material-including stack or a plurality of reactive material stacks). Each unit reactive-material-including stack 60 includes a layer of the first material, i.e., the first non-magnetic material layer 7, and a layer of the second material, i.e., the second non-magnetic material layer 8', and a magnetic material-including layer 9 in any order. The number of layers of the magnetic material may either be equal to or different from the number of layers of the first metal.

In one embodiment, the array of bonding pads 600 can be provided by forming material layers including one or more repetitions of the first non-magnetic material layer 7, the second non-magnetic material layer 8', and the magnetic material-including layer 9 on the second substrate 200, and subsequently patterning the material layers to form the array of bonding pads 600. Each first non-magnetic material layer 7, each second non-magnetic material layer 8', and each magnetic material-including layer 9 can be deposited, for example, by physical vapor deposition (PVD), chemical vapor deposition (CVD), and/or electroplating. Each first non-magnetic material layer 7 and each second non-magnetic material layer 8' are deposited as a continuous material layer. The thickness of each first non-magnetic material layer 7 can be, for example, from 5 nm to 1,000 nm, the thickness of each second non-magnetic material layer 8' can be, for example, from 5 nm to 1,000 nm, and the thickness of each magnetic material-including layer 9 can be, for example, from 5 nm to 1,000 nm, although lesser and greater thicknesses can also be employed. The patterning of the material layers can be performed, for example, by applying a photoresist over the top surface of the material layers, lithographically patterning the photoresist to cover areas corresponding to the areas of the bonding pads 600 to be subsequently formed, and by removing the portions of the material layers that are not covered by the patterned photoresist. The photoresist is subsequently removed.

Referring to FIG. 5A, a first example of the magnetic material-including layer 9 is shown. In the first example, the magnetic material-including layer 9 is formed by depositing discontinuous chunks of a magnetic material as magnetic particles 9P embedded within a non-magnetic matrix 9M, which can include the first material or the second material. The size of the magnetic particles 9P can be from 5 nm to 1,000 nm, although lesser and greater sizes can also be employed.

For example, the magnetic particles 9P can be implanted into an upper portion of a second non-magnetic material layer 8' by increasing the energy of particles sputtered from a sputtering target including the magnetic material, thereby converting the upper portion of the second non-magnetic material layer 8' as the magnetic material-including layer 9. The upper portion of the underlying second non-magnetic material layer 8' is converted into the non-magnetic matrix 9M, while the lower portion of the underlying second non-magnetic material layer 8' remains as the second non-magnetic material layer 8'.

Alternately, the magnetic particles 9P can be deposited without penetrating into the second non-magnetic material layer 8', and the material of the first non-magnetic material layer 7 of the next unit reactive-material-including stack 60 is subsequently deposited. The portion of the first non-magnetic material layer 7 that embeds the magnetic particles 9P is converted into the non-magnetic matrix 9M. The portion of the first non-magnetic material layer 7 that overlies the magnetic particles 9P remains as the first non-magnetic material layer 7.

Figure 5B:
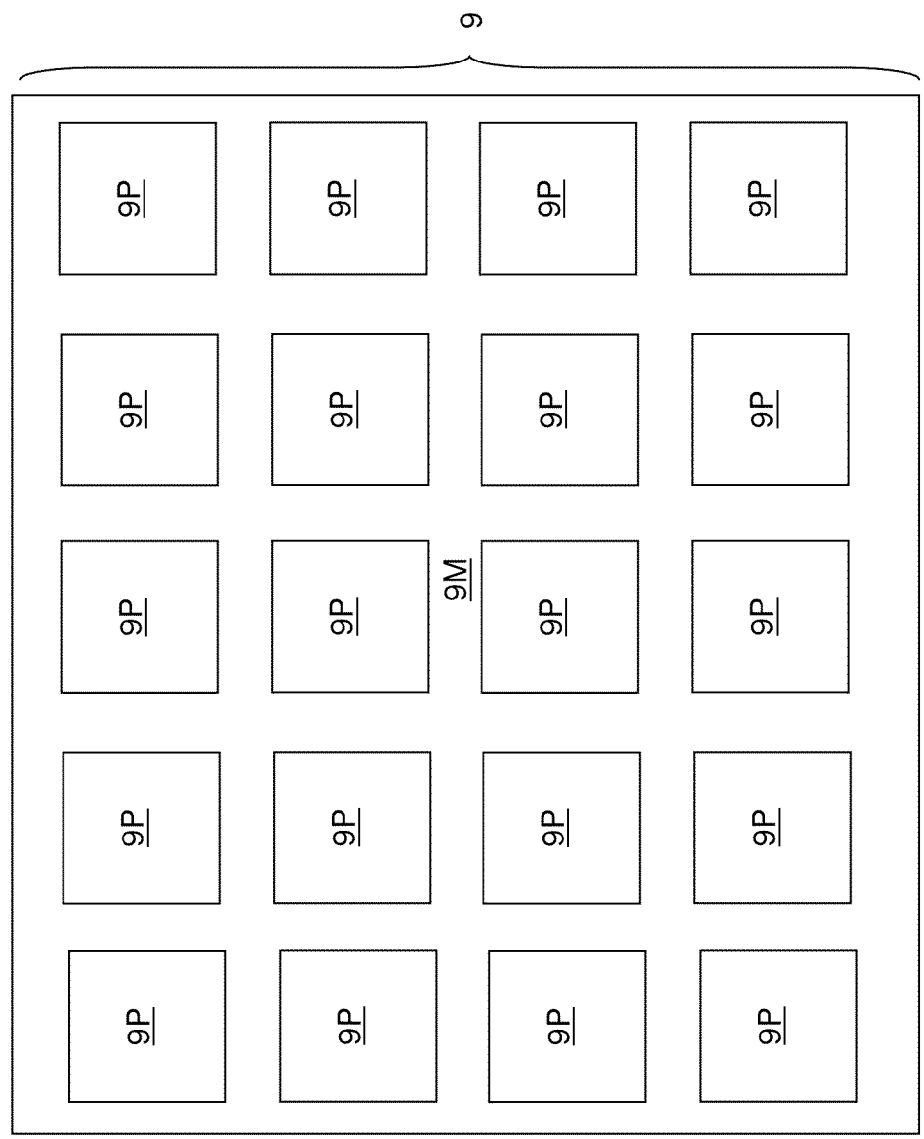
FIG. 5B is a horizontal cross-sectional view of a second example of the magnetic material-including layer according to the second embodiment of the present disclosure.

Referring to FIG. 5B, a second example of the magnetic material-including layer 9 is shown. In the second example, the magnetic material-including layer 9 is deposited as a contiguous layer of the magnetic material, and is subsequently patterned, lithographically or otherwise, to form an array of magnetic particles 9P. The magnetic particles 9P of the second example of the magnetic material-including layer 9 can have a geometrical shape such as a polygon, a circle, an ellipse, or combinations thereof. In one embodiment, the lateral dimensions of the magnetic particles 9P are lithographic dimensions, i.e., dimensions that can be printed by lithographic methods. The non-magnetic matrix 9M can include the non-magnetic material of the next layer to be subsequently deposited, which is one of the first material and the second material.

Referring to FIG. 5C, a third example of the magnetic material-including layer 9 is shown. In the third example, the magnetic material-including layer 9 is deposited as a contiguous layer of the magnetic material, and is subsequently patterned, lithographically or otherwise, to form an array of magnetic particles 9P in the same manner as in the second example of the magnetic material-including layer 9. The magnetic particles 9P are patterned to have lengthwise edges along one direction. By aligning the lengthwise edges of the magnetic particles 9P along the direction of the time-dependent magnetic field B (shown by the arrow labeled "B") during bonding of the first and second substrates (100, 200), more eddy currents can be generated within the magnetic particles 9P, which provides more heating. Further, an easy axis of magnetization of the magnetic particles 9P can be aligned with the lengthwise direction of the magnetic particles, which can lead to a larger hysteresis loop and enhanced heat generation during the bonding.

Figure 6:
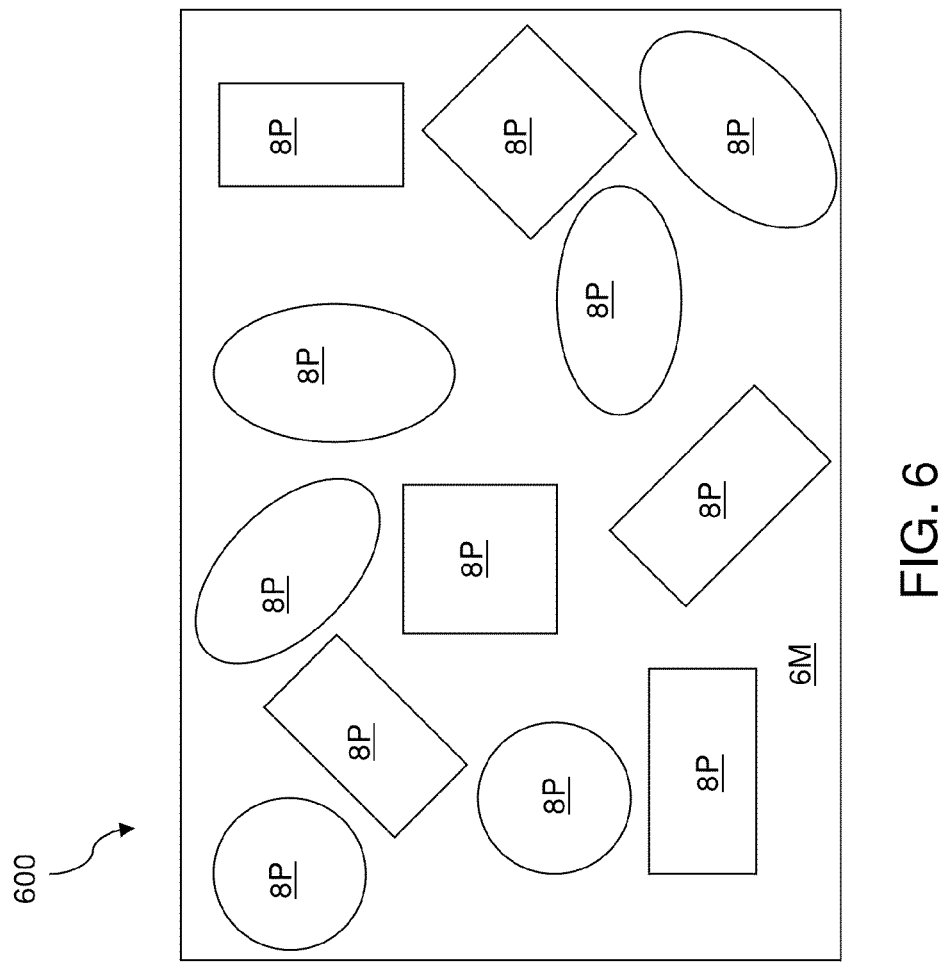
FIG. 6 is a vertical cross-sectional view of a second example of the bonding pad according to a third embodiment of the present disclosure.

Referring to FIG. 6, a second example of a bonding pad 600 according to a third embodiment of the present disclosure is illustrated. The second example of the bonding pad 600 includes a pair of a first material and a second material that constitute a set of reactive materials. The first material can be a magnetic material, and the second material can be a non-magnetic material.

The second example of the bonding pad 600 includes a matrix 6M of the first material and embedded non-magnetic particles 8P of the second material. An array of bonding pads 600 can be provided on the second substrate 200 by forming a material layer including a matrix of the first material embedding particles of the second material on the second substrate 200, and subsequently patterning the material layer to form the array of bonding pads 600. The matrix 6M of the first material and the embedded non-magnetic particles 8P of the second material can be formed by alternately depositing the first material and the second material such that the first material is deposited as a continuous layer and the second material is deposited as discrete particles. For example, the first material can be deposited by physical vapor deposition (PVD) in which fine particles are deposited and to form a continuous layer, and the second material can be deposited by PVD in which coarse particles are deposited to form discrete particles that do not coalesce with one another. The size of the embedded non-magnetic particles 8P can be from 10 nm to 100 nm, although lesser and greater sizes can also be employed.

Figure 7:
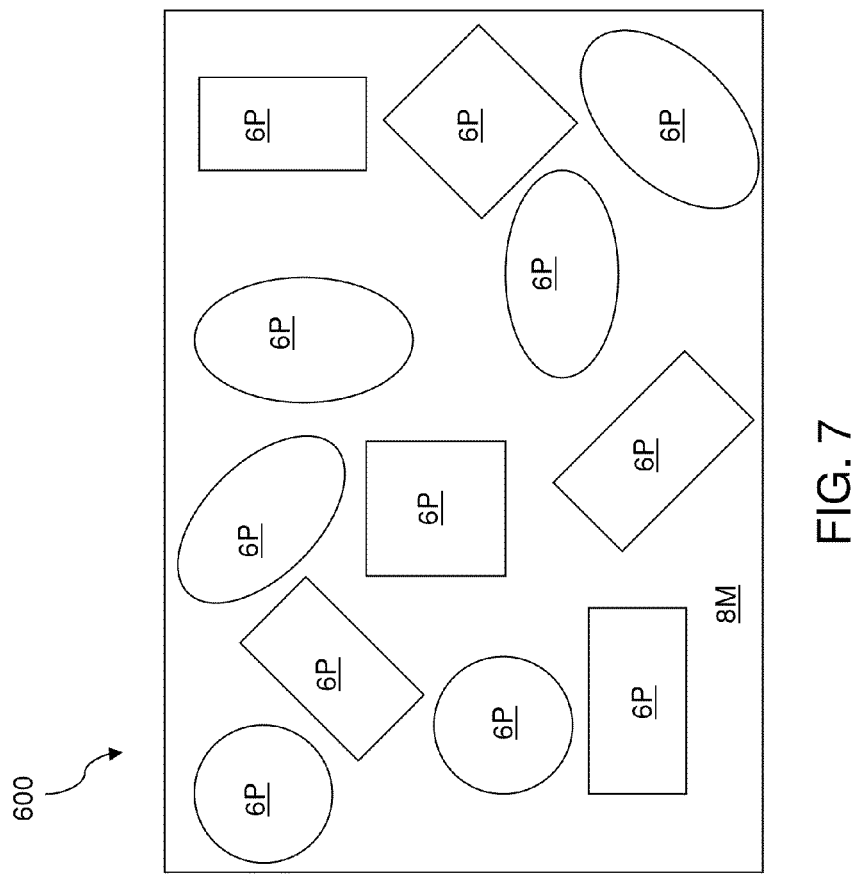
FIG. 7 is a vertical cross-sectional view of a third example of the bonding pad according to a fourth embodiment of the present disclosure.

Referring to FIG. 7, a third example of a bonding pad 600 according to a fourth embodiment of the present disclosure is illustrated. The third example of the bonding pad 600 includes a pair of a first material and a second material that constitute a set of reactive materials. The first material can be a magnetic material, and the second material can be a non-magnetic material.

The second example of the bonding pad 600 includes a matrix 8M of the second material and embedded magnetic particles 6P of the first material. An array of bonding pads 600 can be provided on the second substrate 200 by forming a material layer including a matrix of the second material embedding particles of the first material on the second substrate 200, and subsequently patterning the material layer to form the array of bonding pads 600. The matrix 8M of the second material and the embedded magnetic particles 6P of the first material can be formed by alternately depositing the first material and the second material such that the second material is deposited as a continuous layer and the first material is deposited as discrete particles. For example, the second material can be deposited by physical vapor deposition (PVD) in which fine particles are deposited and to form a continuous layer, and the first material can be deposited by PVD in which coarse particles are deposited to form discrete particles that do not coalesce with one another. The size of the embedded magnetic particles 6P can be from 10 nm to 100 nm, although lesser and greater sizes can also be employed.

Figure 8:
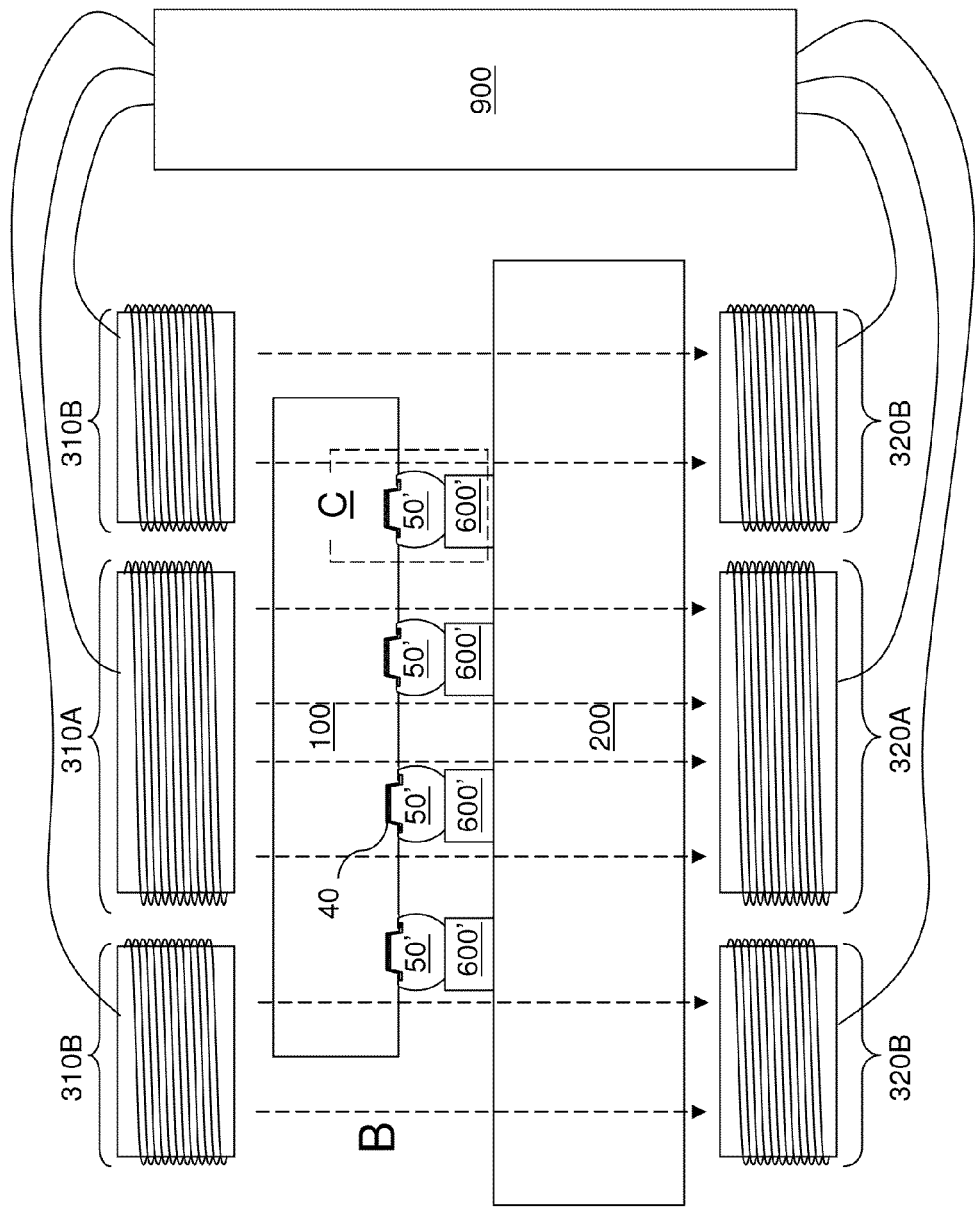
FIG. 8 shows a vertical cross-sectional view of the first exemplary structure during reactive bonding of substrates according to an embodiment of the present disclosure.

Referring to FIG. 8, after the array of solder balls 50 is brought into contact with the array of bonding pads 600, a reactive bonding process is performed on the assembly of the first substrate 100, the second substrate 200, the array of solder balls 50, and the array of bonding pads 600. The configuration of FIG. 8 illustrates a geometry in which the magnetic field B is perpendicular to the plane at which the array of solder balls 50 contacts the array of bonding pads 600.

The set of reactive materials including the first material and the second material is ignited by heating the magnetic material through a time-dependent magnetic field generated by the apparatus (900, 301A, 310B, 320A, 320B). The heat initiates a self-sustaining and self-propagating exothermic reaction between the first material and the second material. The temperature of the array of solder balls 50 is elevated above the reflow temperature of the solder material of the solder balls 50 by the heat generated by the exothermic reaction. The array of solder balls 50 is bonded to the array of bonding pads 50 through heat generated by spontaneous reaction of the set of reactive materials, thereby converting the assembly into a bonded structure.

Figure 9:
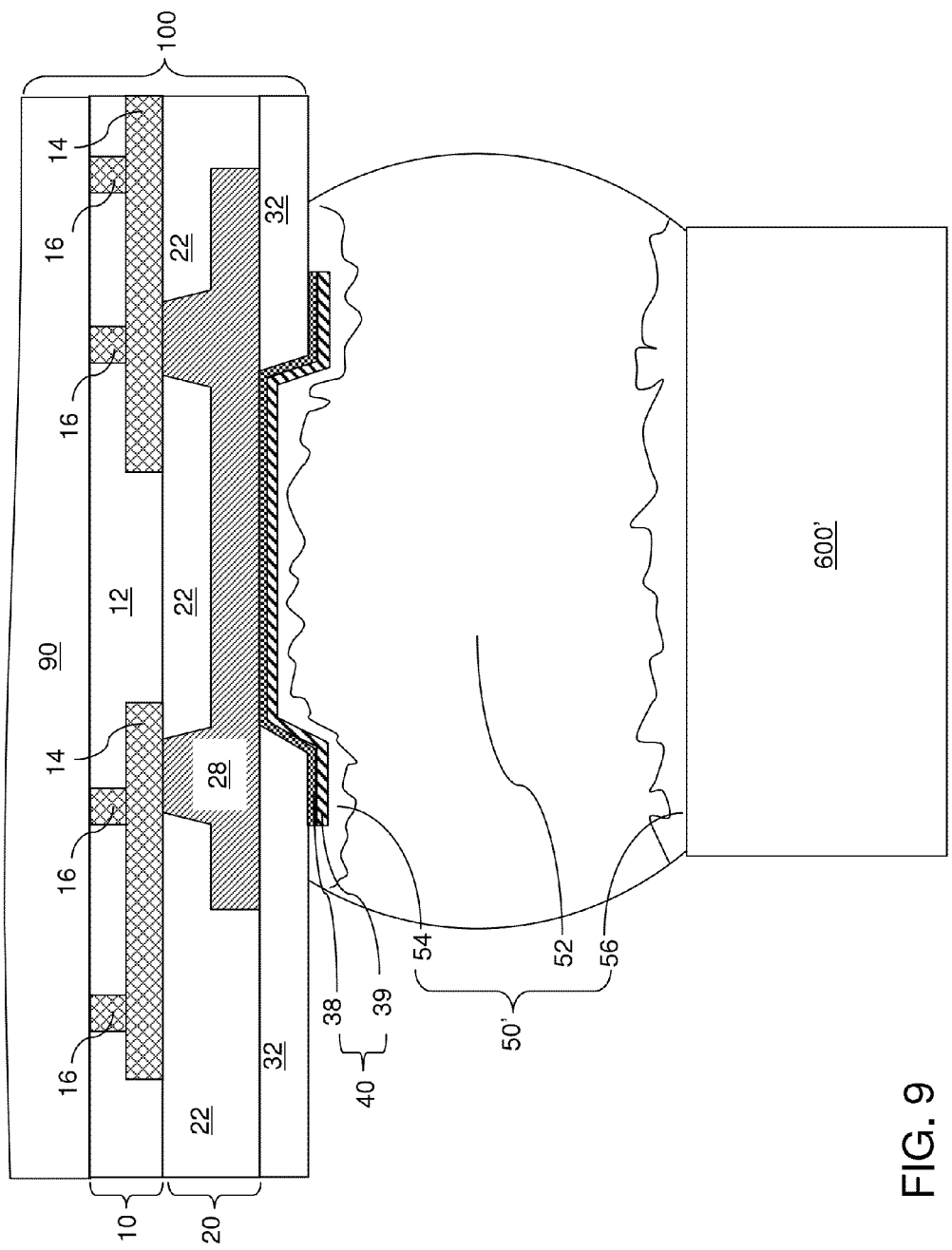
FIG. 9 is a magnified view of region C of FIG. 8.

Upon cooling of the solder balls, the bonded structure includes an array of reacted material pad 600', which includes an alloy or a composite of the first material and the second material. As illustrated in FIG. 9, each reacted material pad 600' includes the reacted material derived from the original material of a bonding pad 600, i.e., the first material and the second material and the optional additional material. Further, the bonded structure includes an array of solder balls 50'. Each solder ball 50' includes the original composition region 52 which includes the original composition of the solder ball 50 before bonding to the first substrate 100, an altered composition region 54 which has a composition that is modified from the original composition of the solder material by diffusion of the materials from the first-substrate bonding pad 40, and another altered composition region 56 which has a composition that is modified from the original composition of the solder material by diffusion of the materials from the bonding pad 600 during the reactive bonding process.

In one embodiment, the time-dependent magnetic field can have a substantially uniform peak magnitude across an entirety of the array of bonding pads 600 when turned on. In this case, the reactive bonding of all bonding pads 600 to the solder balls 50 can occur simultaneously.

The frequency of the time-dependent magnetic field can be from 10 Hz to 1 GHz, although lesser and greater frequencies can also be employed. In one embodiment, the frequency of the time-dependent magnetic field can be from 50 Hz to 1 MHz.

The waveform of the electrical current supplied to the various electromagnets (310A, 310B, 320A, 320B) can be sinusoidal or non-sinusoidal. Correspondingly, the time-dependence of the time-dependent magnetic field can be sinusoidal or non-sinusoidal.

In another embodiment, the time-dependent magnetic field has a spatially varying magnitude across at least a portion of the array of bonding pads when turned on. In one embodiment, the spatially varying magnitude of the time-dependent magnetic field can be employed to trigger the ignition of the set of reactive materials at different time points for different bonding pads 600.

Alternatively or additionally, the operational frequency of the time-dependent magnetic field can be changed during the igniting of the set of reactive materials to trigger the ignition of the set of reactive materials at different time points for different bonding pads 600.

Figure 10:
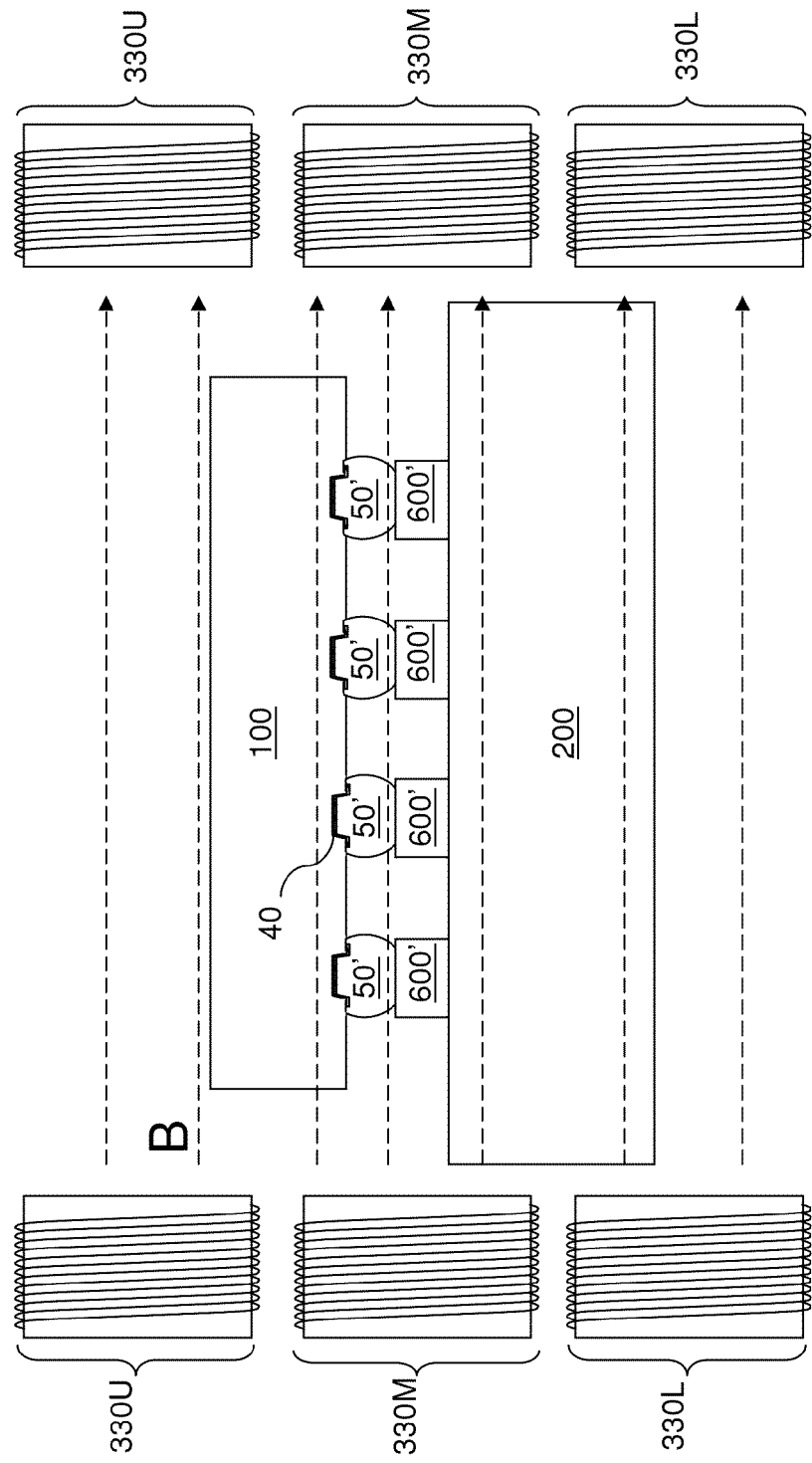
FIG. 10 shows a vertical cross-sectional view of a second exemplary structure during reactive bonding of substrates according to an embodiment of the present disclosure.

Referring to FIG. 10, a second exemplary structure is illustrated during reactive bonding of substrates according to an embodiment of the present disclosure. The configuration of FIG. 10 illustrates a geometry in which the magnetic field B is parallel to the plane at which the array of solder balls 50 contacts the array of bonding pads 600. The electromagnets can include an upper electromagnet pair 330U, a middle electromagnet pair 330M, and a lower electromagnet pair 330L, each of which can be independently controlled by a power supply device (not shown).

In general, the direction of the time-dependent magnetic field can be adjusted to maximize the heating of the magnetic material in the bonding pads 600 (See FIG. 1). For example, if the magnetic material in the bonding pads 600 has lengthwise edges along one direction as in the example illustrated in FIG. 5C, the magnetic field B can be aligned along the lengthwise edges of the magnetic material to increase eddy currents within the magnetic material and to provide more heating. Further, if an easy axis of magnetization of the magnetic material is aligned along one direction within the magnetic material in the bonding pads 600, the magnetic field can be applied along the direction of the easy axis of magnetization to provide a larger hysteresis loop and greater heat generation during the bonding.

Figure 11:
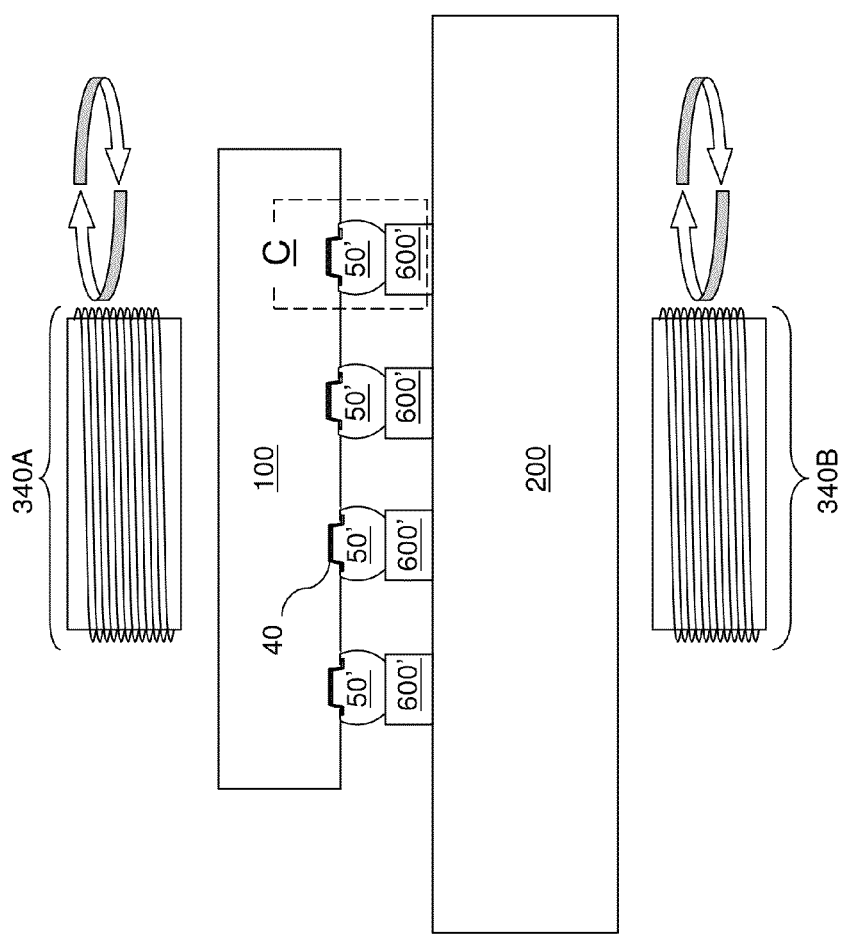
FIG. 11 shows a vertical cross-sectional view of a third exemplary structure during reactive bonding of substrates according to an embodiment of the present disclosure.

Referring to FIG. 11, a third exemplary structure is illustrated during reactive bonding of substrates according to an embodiment of the present disclosure. The configuration of FIG. 10 illustrates a geometry in which the magnetic field B includes a spatially varying region. The electromagnets can include an upper electromagnet 340A and a lower electromagnet 340 that are configured to move in synchronization with each other at least in horizontal directions. The upper electromagnet 340A and the lower electromagnet 340B can be controlled by a power supply device (not shown).

After the array of solder balls 50 is brought into contact with the array of bonding pads 600, the assembly including the first substrate 100 and the second substrate 200 can be moved relative to the apparatus (340A, 340B) that generates the time-dependent magnetic field. A region of maximum magnitude of the time-dependent magnetic field can sequentially overlap with different bonding pads 600 among the array of bonding pads 600, thereby igniting different bonding pads 600 at different times.

In one embodiment, the operational frequency of the time-dependent magnetic field can be changed during the igniting of the set of reactive materials. Further, different bonding pads 600 can be ignited employing different operational frequencies for the time-dependent magnetic field.

In one embodiment, the methods of the present disclosure can be utilized to enable use of high temperature solder materials, which have better electromigration performance and thermal migration performance relative to low temperature solder materials. Further, the methods of the present disclosure can be utilized to reduce overall chip-package stress, thereby improving reliability. Yet further, the methods of the present disclosure can be utilized to provide a flux-less bonding procedure, which also improves underfill reliability via increased adhesion and decreased voiding. Still further, the methods of the present disclosure enables soldering of a semiconductor chip to a packaging substrate by a local heating mechanism, which does not heat the entire packaging substrate, and thereby reduces or avoids the warping of the packaging substrate. In addition, the ignition of the set of reactive materials is enabled without contacting the semiconductor chip, the packaging substrate, the solder balls 50, or the bonding pads 600 with any electrode.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of bonding substrates comprising:
   providing a first substrate bonded to an array of solder balls;
   providing a second substrate having an array of bonding pads thereupon, wherein each of said bonding pads comprises at least one unit of a reactive-material-including stack that includes a layer of a first non-magnetic material, a layer of a second non-magnetic material and a magnetic material-including layer comprising a magnetic material and one of said first non-magnetic material and said second non-magnetic material, wherein upon ignition, said first non-magnetic material and said second non-magnetic material react spontaneously to form an alloy or a composite of said first non-magnetic material and said second non-magnetic material;

bringing said array of solder balls into contact with said array of bonding pads; and igniting said at least one unit of said reactive-material-including stack by heating said magnetic material through a time-dependent magnetic field, wherein said array of solder balls is bonded to said array of bonding pads through heat generated by a spontaneous reaction of said first non-magnetic material and said second non-magnetic material.

2. The method of claim 1, wherein said providing of said second substrate having said array of bonding pads thereupon comprises:

forming material layers including one or more repetitions of said layer of said first non-magnetic material, said layer of said second non-magnetic material and said layer of said magnetic material-including layer on said second substrate; and patterning said material layers to form said array of bonding pads.

3. The method of claim 1, wherein said magnetic material-including layer comprises a structure including magnetic particles embedded in said one of said first non-magnetic material and said second non-magnetic material.

4. The method of claim 3, wherein said embedded magnetic particles are formed by implanting said magnetic particles into an upper portion of said layer of said second non-magnetic material.

5. The method of claim 3, wherein said embedded magnetic particles are formed by:

deposing discontinuous chunks of said magnetic particles on said layer of said second non-magnetic material; and forming another layer of said first non-magnetic material of another unit of said reactive-material-including stack on said magnetic particles and said layer of said second non-magnetic material.

6. The method of claim 3, wherein said embedded magnetic particles is an array of magnetic particles.

7. The method of claim 6, wherein said array of magnetic particles is formed by:

depositing a contiguous layer of said magnetic material on said layer of said second non-magnetic material; and patterning said contiguous layer of said magnetic material to provide said array of said magnetic particles.

8. The method of claim 7, further comprising depositing another layer of said first non-magnetic material of another unit of said reactive-material-including stack on said array of said magnetic particles.

9. The method of claim 6, wherein said array of said magnetic particles have lengthwise edges along a direction of said time-dependent magnetic field.

10. The method of claim 1, wherein said time-dependent magnetic field has a substantially uniform peak magnitude across an entirety of said array of bonding pads when turned on.

11. The method of claim 1, wherein said time-dependent magnetic field has a spatially varying magnitude across at least a portion of said array of bonding pads when turned on.

12. The method of claim 11, further comprising moving an assembly of said first substrate and said second substrate after said bringing of said array of solder balls into contact with said array of bonding pads relative to an apparatus that generates said time-dependent magnetic field, wherein a region of maximum magnitude of said time-dependent magnetic field sequentially overlaps with different bonding pads among said array of bonding pads.

13. The method of claim 12, wherein said time-dependent magnetic field has a spatially varying magnitude, and said method further comprises igniting different bonding pads employing different operational frequencies for said time-dependent magnetic field.

14. The method of claim 1, further comprising changing an operational frequency of said time-dependent magnetic field during said igniting of said set of reactive materials.

15. The method of claim 1, wherein said first non-magnetic material comprises Al or Ti.

16. The method of claim 1, wherein said second non-magnetic material comprises Ti, amorphous Si, Pt or $CuO_x$, wherein x is equal to 0.5, 0.75 or 1.0.

17. The method of claim 1, wherein said magnetic material comprises Fe, Co, Ni or a magnetic rare-earth material.

* * * * *